United States Patent [19]

Trainer et al.

[11] Patent Number: 5,077,744
[45] Date of Patent: Dec. 31, 1991

[54] METHOD FOR ERROR PROTECTION IN TELEPHONE SWITCHING INSTALLATIONS

[75] Inventors: Carl Trainer, Argelsried; Hans-Werner Knefel, Martinsried, both of Fed. Rep. of Germany

[73] Assignee: Siemens Aktiegesellschaft, Berlin and Munich, Fed. Rep. of Germany

[21] Appl. No.: 388,097

[22] Filed: Aug. 1, 1989

[30] Foreign Application Priority Data

Aug. 2, 1988 [DE] Fed. Rep. of Germany ....... 3826248

[51] Int. Cl.$^5$ ............................................. G06F 11/16
[52] U.S. Cl. .................................. 371/68.1; 371/21.2; 371/51.1
[58] Field of Search .............. 371/68.1, 68.2, 68.3, 371/67.1, 71, 24, 25.1, 37.3, 21.2, 51.1, 48

[56] References Cited

U.S. PATENT DOCUMENTS

| | | | |
|---|---|---|---|
| 3,544,777 | 12/1970 | Winkler | 371/68.1 X |
| 3,781,796 | 12/1973 | Smith | 371/68.1 |
| 3,944,800 | 3/1976 | Beck | 371/68.1 |
| 4,295,219 | 10/1981 | Draper | 371/51.1 |
| 4,319,355 | 3/1982 | Mollier | 371/21.2 |
| 4,744,061 | 5/1988 | Takemae | 371/68.1 X |
| 4,843,608 | 6/1989 | Fu | 371/68.1 |
| 4,943,969 | 7/1990 | Criswell | 371/68.1 |

FOREIGN PATENT DOCUMENTS

| | | | |
|---|---|---|---|
| 134343 | 8/1983 | Japan | 371/68.1 |
| 17495 | 6/1984 | Japan | 371/68.1 |

OTHER PUBLICATIONS

J. Irwin, "Microprocessor Error Logout", IBMTDB, vol. 18, No. 4, 9/1975, pp. 1011-1013.
K. Bobart, "Error Location In Bar Code Scanning", IBMTDB, vol. 24, No. 1A, 6/1981, pp. 142-144.
N. Loeber, "Data Compare Feature Modification", IBMTDB, vol. 17, No. 12, 5/1975, pp. 3726-3727.

Primary Examiner—Robert W. Beausoliel
Attorney, Agent, or Firm—Adel A. Ahmed

[57] ABSTRACT

Data are error protected; dual memory control is utilized. From one memory control only write-in data are transmitted in addition to address and control signals; from the other memory control only control data is transmitted. In the first case they are inputted into the user data segment of a segmented memory, while in the second case, they are inputted into the control data segment of the memory from whence they are both included into the data check. Thereby, address errors may also be recognized.

4 Claims, 2 Drawing Sheets

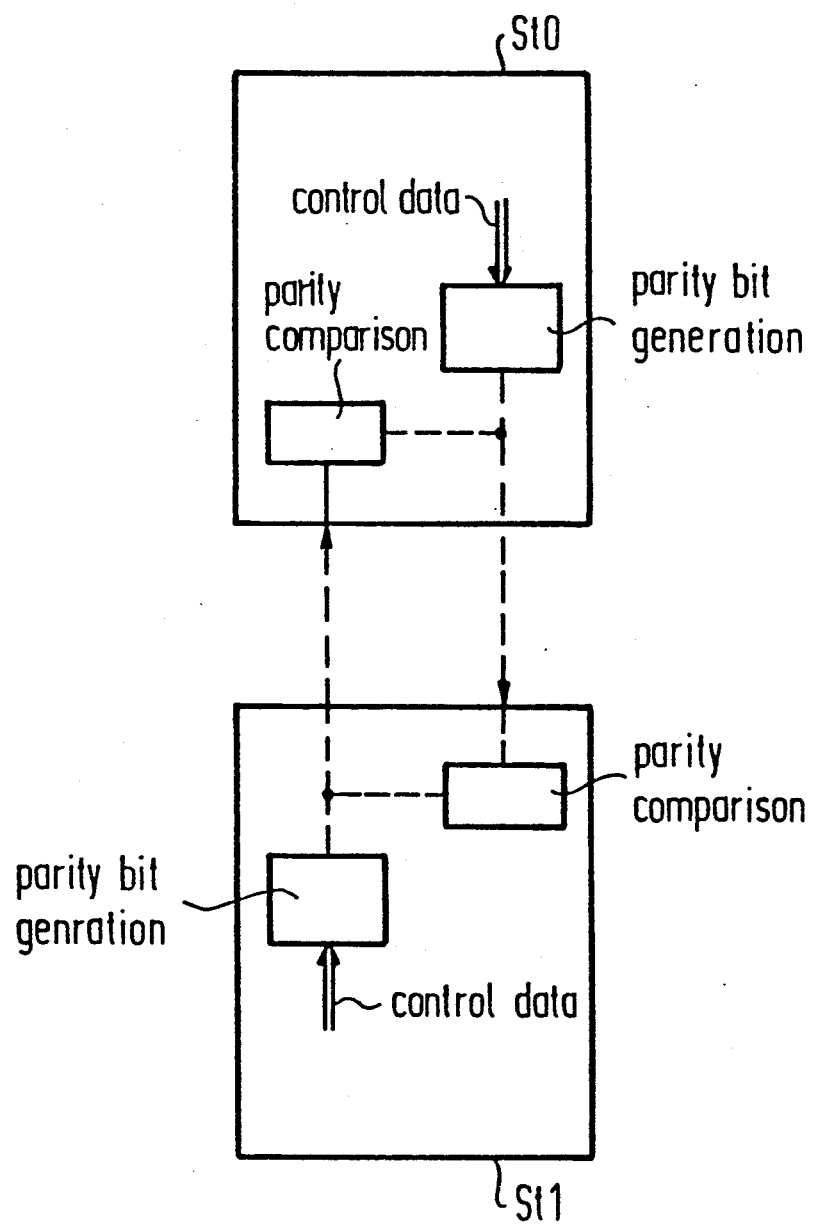

METHOD FOR ERROR PROTECTION IN TELEPHONE SWITCHING INSTALLATIONS

The present invention relates to a method for error recognition in memory systems of data processing facilities, and more particularly in telephone switching installations for storing error protected data with dual memory control at least in the central portions which receive all incoming signals.

In memory systems of the aforementioned type, not only should information errors caused by malfunction of the actual information memory (medium malfunction) be recognized and corrected if necessary, but also errors that are caused by defects in the control.

Figure 1:
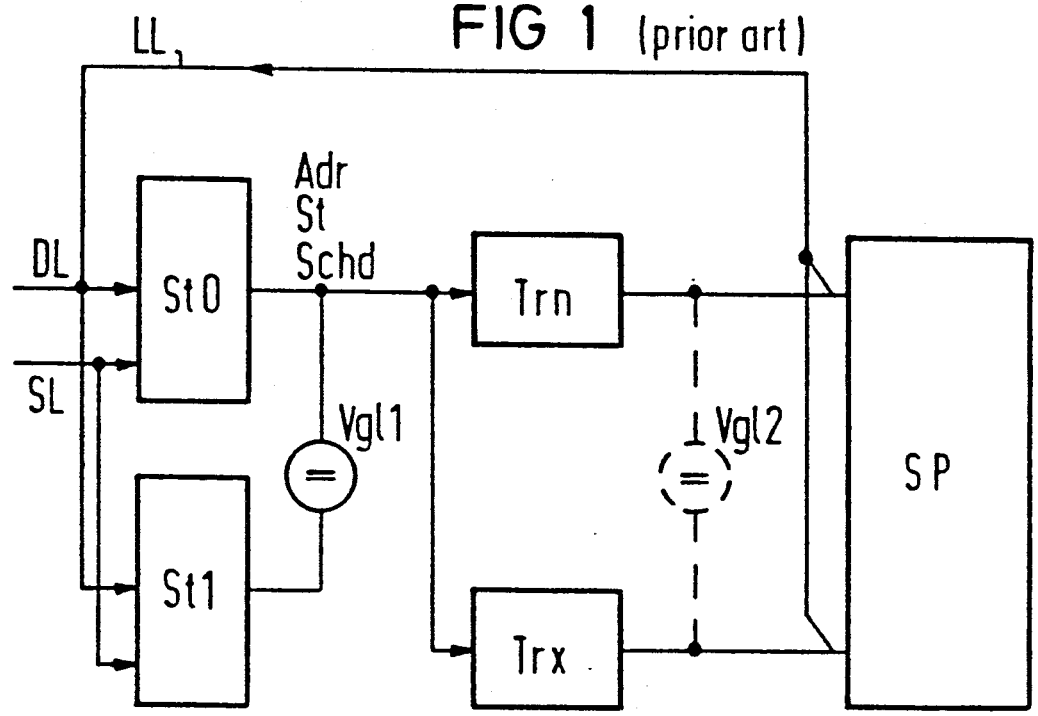

FIG. 1 illustrates measures hitherto applied in a block diagram of a memory system of the type to which the method in accordance with the invention relates. In this known memory system, at least the central portions of a memory control St0 and St1 are doubled. These memory control portions are supplied with all incoming signals, namely the write-in data coming in on a data line DL and address signals and control signals on a signal line SL. Control parts St0 and St1 also contain arrangements for performing data checking and data correction. The first control bit generation is performed here, insofar as control bits for data protection have not been already generated before data transmission and are therefore not contained in the incoming data stream.

The control bits which are transmitted together with the associated data bits or inputted in the memory SP are created by partial parity generation in the data words. The data check is then performed in such a manner that, after the read-out of the data words and the associated control bits, the corresponding partial parity generation is performed again and the control bits originated in this manner are compared with the original control bits. In case of error, one can detect faulty control bit words, if single errors occur, from the pattern of the nonconformity of the control bit words formed by the control bits and correspondingly correct them. In the case of multiple errors an error message is possible.

In the memory system in accordance with FIG. 1, the write-in data, the addresses and the control signals which are provided by a first portion as well as a second portion of a memory controller, St0 and St1, are compared by means of a comparator Vg11, so that erroneous output signals can be recognized. Only the signals provided by controller St0 are fed to memory SP by means of drivers, a plurality of which is provided so as to obtain the required drive capacity for the memory blocks of memory SP, which are preferably disposed in pairs. Of this plurality of drivers, a pair TRN and TRX is illustrated. The output signals which are provided from these pairs of drivers are compared by means of drive comparators Vg12 of which the comparator belonging to the pair of drivers TRN and TRX is shown. Thus, as comparators Vg12 are disposed at the end of the line connection between driver output and memory input, the drivers as well as their connecting lines are monitored. Advantageously, memory SP is so organized that it comprises separately driveable control units which only store one bit of a memory word, so that medium errors preferentially result in single errors, which can be recognized and corrected through the afore-mentioned data check.

Comparators Vg11 and Vg12 are required because address defects which could result in recording or read-out of an erroneous memory word would not be recognizable by the data check of read-out memory words on the basis of the above-mentioned data protection measures.

The error recognition concept described above is very effective, but the outlay for the comparators and routine checking thereof is very high. Moreover, the required comparison procedures are very often only possible at the expense of longer memory cycle times.

An object of the invention is to provide a simpler error recognition concept.

According to an aspect of the invention, this task is solved in that the actual user data are inputted by the first of the dual memory controllers and the control bits associated therewith in conjunction with the data protection are inputted by the second of the dual memory controllers in separate clock-controlled synchronously driven memories for user data or control data, from where they are both included in the data check during read-out.

In contrast to the known memory system according to FIG. 1, comparator Vg11 and multiple comparator Vg12 are omitted from the procedure in accordance with the invention, and still a relatively good degree of error recognition is achieved. In the light of the memory organization according to the invention, only the user data memory or the control data memory will be affected in case of an address error, so that during a data check in conjunction with the read-out, where both the user data and control data are included, an error will be recognized. Even if multiple errors are initially not recognized or erroneously appear as correctable single errors, due to the high address variation in the memory cycles, a genuine multiple bit recognition will result. In accordance with a further embodiment of the invention, the control data from the second memory controller which have to be inputted in the corresponding separate memory are compared with the corresponding control data available in the first memory controller before being outputted.

As a result, the data check during read-out will not erroneously lead to a data "correction"(which would indeed amount to introducing error into the data) in those cases in which error in the user data occurs only in the second memory controller and accordingly the associated control data no longer correspond to the error-free user data actually stored by the first user data controller in the user data memory, or if the control data generation is interfered with in the second memory controller. When in accordance with one embodiment of the invention the said comparison is performed in the form of a parity check, the expense is relatively low, although the degree of recognition is still sufficiently high.

Figure 2:
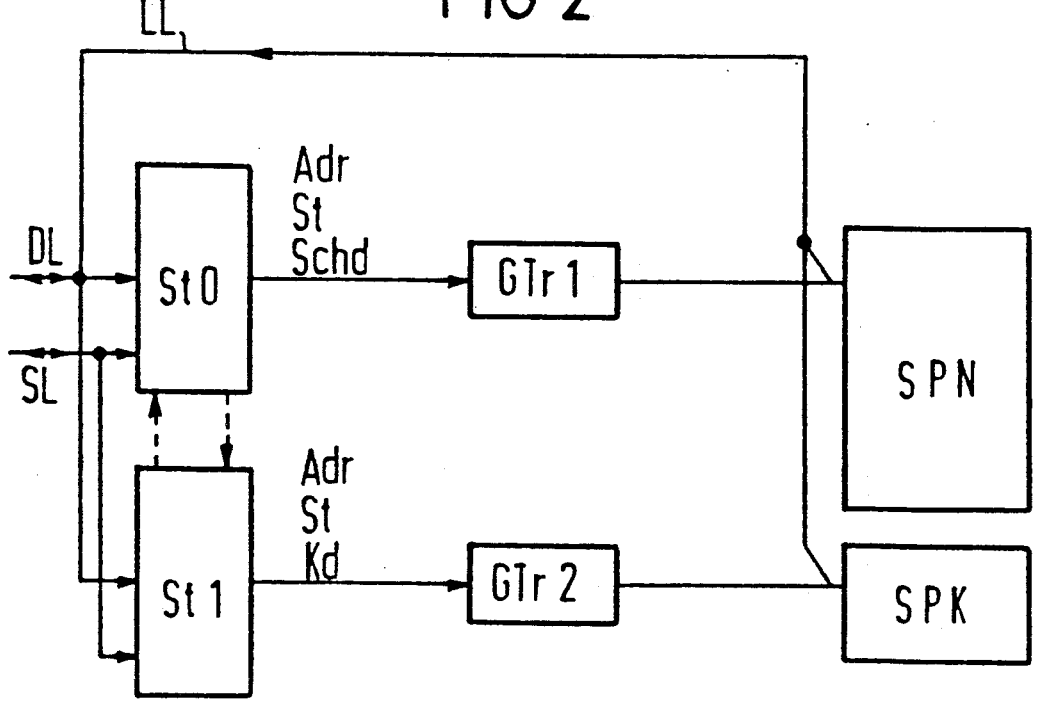

In the following, the invention will be explained in greater detail in conjunction with the drawing, in which FIG. 1 shows the state-of-the-art memory system already described; and FIG. 2 shows a memory system for carrying out the method in accordance with the invention.

FIG. 3 shows a circuit arrangement for parity generation and comparison.

FIG. 2 illustrates, as does FIG. 1, a dual memory control with memory controllers St0 and St1, which also contain arrangements for data checking or data correction. To perform the method in accordance with the invention, it is immaterial whether the user data which are received through the data lines DL were already provided with corresponding control data at the transmitting end, or whether these control data are first generated in the devices St0 and St1.

In any case, the available corresponding control data, as indicated by the broken line connecting arrows of the two controllers, are subjected to a parity check, such that in case of conformity, it is assured with a high degree of probability that the associated user data also correspond with each other. This is of particular importance when the write-in of new user data is performed in such a manner that read-out user data are partially changed, for example, in one of a plurality of bytes generating a memory word, and accordingly, a new control data generation becomes necessary.

As FIG. 2 further illustrates, address signals Adr, control signals St and write-in data Schd are passed on by the first controller St0 from the data available (however, not the control data associated with the write-in data), i.e., through a first group of drivers GTr1. In contrast thereto, the other controller St1 provides, in addition to the address signal Adr and control signals ST, the control data Kd which is associated with the write-in data Schd, but not the write-in data themselves through a second group of drivers GTr2.

Further, FIG. 2 illustrates that the data memory is divided into a user data memory SPN and a control data memory SPK. These memories are reached in one case through a driver group GTr1 and in the other case through a driver group GTr2.

As a consequence of the segmentation of the memory, a drive defect, which may be caused by either an erroneous address generation in the central controllers St0 and St1 or by a defect of the corresponding driver, can only affect memory SPN or SPK with any high degree of probability.

Memories SPN and SPK are synchronously clocked and deliver during read-out associated user data and control data through line LL to the devices associated with the dual memory controls St0 and St1 for data checking and data correction. Data checking is performed there, as indicated, in such a manner that control data are generated again for the read-out user data in accordance with the pre-established generation rules and these control data are compared with the control data read-out of the memory. A typical arrangement is shown in FIG. 3, wherein parity bit generation is accommodated by the first controller St0 from the control data. This parity signal generated by the parity bit generator in St1 from the input control data. As seen in FIG. 3, parity is generated from associated control data inputted to St0 and St1 and the locally generated parity is compared with the parity generated by the other controller.

In the case of an address error which, as already shown, could only affect either the user data memory or the control data memory, errors can be identified with a high degree of probability with such data checking.

We claim:

1. In a memory system used in a data processing facility for storing error protected data, said system having a first memory controller (St0) and a second memory controller (St1) where said first and second memory controllers each receive all incoming signals, namely, write-in data signals (Schd) on an input data line (DL) and address (Adr) and control signals (St) on a signal input line (SL) with each controller having an output and with a data memory (SPN) coupled to said first and second controllers for storing said incoming signals, with said first and second controllers capable of providing control bits indicative of control data (KD) for data protection which control bits are associated with given data bits, a method employed with said memory system for error recognition comprising the steps of:

providing only said address signals (Adv), said control signals (St) and said write-in data signals (Schd) at the output of said first controller;

providing only said address signals (Adr), said control signals (St) and said control data (Kd) at the output of said second controller;

inputting said output of said first controller into said data memory (SPN);

synchronously inputting said output of said second controller into another memory (SPK) wherein said write-in data signals and said control data are always inputted under the same address in said synchronously inputted memories (SPN, SPK)l and data checking said stored control data from said another memory with said write-in data from data memory.

2. The method according to claim 1, wherein said data checking includes comparing said control data to be inputted into said another memory with corresponding control data to be outputted by said first controller.

3. The method according to claim 2, wherein the steps of comparing includes formulating parity bits for each control data and write-in data and comparing said parity bit.

4. The method according to claim 1 further including the steps of:

synchronously reading associated write-in data and control data stores in said memories; and delivering said stored data to the input data line (DL) of said first and second controllers.

* * * * *